United States Patent
Hidaka

(10) Patent No.: US 7,313,042 B2
(45) Date of Patent: Dec. 25, 2007

(54) THIN FILM MAGNETIC MEMORY DEVICE HAVING AN IMPROVED READ OPERATION MARGIN

(75) Inventor: Hideto Hidaka, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 11/314,028

(22) Filed: Dec. 22, 2005

(65) Prior Publication Data

US 2006/0104109 A1   May 18, 2006

Related U.S. Application Data

(62) Division of application No. 10/622,473, filed on Jul. 21, 2003, now Pat. No. 7,006,373, which is a division of application No. 09/986,865, filed on Nov. 13, 2001, now Pat. No. 6,614,681.

(30) Foreign Application Priority Data

Jun. 28, 2001   (JP) ............... 2001-196417

(51) Int. Cl.
*G11C 7/02* (2006.01)

(52) U.S. Cl. ............... 365/209; 365/171; 365/189.07; 365/189.08; 365/203; 365/207

(58) Field of Classification Search ............ 365/209 O, 365/158, 171 X, 189.07 X, 189.08 X, 189.09, 365/190, 203 X, 207 X, 209, 171, 189.07, 365/189.08, 203, 207
See application file for complete search history.

(56) References Cited

U.S. PATENT DOCUMENTS 5,173,873 A   12/1992  Wu et al.
5,519,662 A * 5/1996  Ishibashi et al. ............ 365/207

(Continued)

FOREIGN PATENT DOCUMENTS

DE   199 14 488 C1   5/2000

(Continued)

OTHER PUBLICATIONS

Durlam, M. et al., "Nonvolatile RAM based on magnetic tunnel junction elements" IEEE International Solid-State Circuits Conference, Feb. 7-9, 2000, pp. 96-97, 128-131 and 410-411.
Scheuerlein, R. et al., "A 10ns read and write nonvolatile memory array using a magnetic tunnel junction and FET switch in each cell" IEEE International Solid-State Circuits Conference, Feb. 7-9, 2000, pp. 94-95, 128-129 and 409-410.

(Continued)

*Primary Examiner*—VanThu Nguyen
(74) *Attorney, Agent, or Firm*—McDermott Will & Emery LLP

(57) ABSTRACT

A data bus is precharged to a precharge voltage before data read operation. In the data read operation, the data bus thus precharged is electrically coupled to the same voltage as the precharge voltage through a selected memory cell. A driving transistor couples the data bus to a power supply voltage (driving voltage) in order to supply a sense current in the data read operation. A charge transfer amplifier portion produces an output voltage according to an integral value of the sense current (data read current) flowing through the data bus, while maintaining the data bus at the precharge voltage. A transfer gate, differential amplifier and latch circuit produce read data based on the output voltage sensed at prescribed timing.

10 Claims, 13 Drawing Sheets

U.S. PATENT DOCUMENTS

| | | | |
|---|---|---|---|
| 5,774,181 A * | 6/1998 | Shyu et al. | 348/300 |
| 6,046,929 A | 4/2000 | Aoki et al. | |
| 6,128,239 A | 10/2000 | Perner | |
| 6,185,143 B1 | 2/2001 | Perner et al. | |
| 6,188,615 B1 | 2/2001 | Perner et al. | |
| 6,205,073 B1 * | 3/2001 | Naji | 365/209 |
| 6,215,713 B1 * | 4/2001 | Austin | 365/205 |
| 6,349,054 B1 | 2/2002 | Hidaka | |
| 6,778,430 B2 | 8/2004 | Hidaka | |
| 2002/0093848 A1 | 7/2002 | Thewes et al. | |

FOREIGN PATENT DOCUMENTS

| | | |
|---|---|---|
| DE | 101 30 829 A1 | 7/2002 |
| EP | 1 104 092 A2 | 5/2001 |

OTHER PUBLICATIONS

Yamada, K. et al., "A novel sensing scheme for a MRAM with a 5% MR ratio" Symposium on VLSI Circuits, Jun. 14-16, 2001, pp. 123-124.

Zhang, R. et al., "Windowed MRAM sensing scheme" IEEE International Workshop on Memory and Technology, Design and Testing, Aug. 7-8, 2000, pp. 47-55.

Kawashima, S. et al., "A charge-transfer amplifier and an encoded-bus architecture for low-power SRAM's" IEEE Journal of Solid-State Circuits, vol. 33, No. 5, May 1998, pp. 793-799.

Naji, et al., "A 256kb 3.0V iTiMTJ Nonvolatile Magnetoresistive RAM," ISSCC Digest of Technical Papers, TA7.6, Feb. 2001, pp. 122-123 and 438.

* cited by examiner

US 7,313,042 B2

THIN FILM MAGNETIC MEMORY DEVICE HAVING AN IMPROVED READ OPERATION MARGIN

RELATED APPLICATIONS

This application is a divisional of U.S. patent application Ser. No. 10/622,473 filed Jul. 21, 2003 now U.S. Pat. No. 7,006,373, which is a divisional of U.S. patent application Ser. No. 09/986,865 filed Nov. 13, 2001 now U.S. Pat. No. 6,614,681, which is based on Japanese Patent Application No. JP 2001-196417, filed Jun. 28, 2001 the contents of which are hereby incorporated by reference.

BACKGROUND OF INVENTION

1. Field of the Invention

The present invention generally relates to a thin film magnetic memory device. More particularly, the present invention relates to a thin film magnetic memory device capable of random access and including memory cells having a magnetic tunnel junction (MTJ).

2. Description of the Background Art

An MRAM Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the performance of the MRAM device is significantly improved by using tunnel magnetic resistive elements having a magnetic tunnel junction (MTJ) as memory cells. The MRAM device including memory cells having a magnetic tunnel junction is disclosed in technical documents such as "A 10ns Read and Write Non-Volatile Memory Array Using a Magnetic Tunnel Junction and FET Switch in Each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 13 is a schematic diagram showing the structure of a memory cell having a magnetic tunnel junction (hereinafter, sometimes simply referred to as "MTJ memory cell").

Referring to FIG. 13, the MTJ memory cell includes a tunnel magnetic resistive element TMR having its electric resistance value varying according to the storage data level, and an access transistor ATR. The access transistor ATR is formed from a field effect transistor, and is coupled between the tunnel magnetic resistive element TMR and the ground voltage VSS.

For the MTJ memory cell are provided a write word line WWL for instructing a data write operation, a read word line RWL for instructing a data read operation, and a bit line BL serving as a data line for transmitting an electric signal corresponding to the storage data level in the data read and write operations.

FIG. 14 is a conceptual diagram illustrating the data read operation from the MTJ memory cell.

Referring to FIG. 14, the tunnel magnetic resistive element TMR has a magnetic layer FL having a fixed magnetic field of a fixed direction (hereinafter, sometimes simply referred to as "fixed magnetic layer FL"), and a magnetic layer VL having a free magnetic field (hereinafter, sometimes simply referred to as "free magnetic layer VL"). A tunnel barrier TB of an insulator film is provided between the fixed magnetic layer FL and the free magnetic layer VL. According to the storage data level, either a magnetic field of the same direction as that of the fixed magnetic layer FL or a magnetic field of the direction different from that of the fixed magnetic layer FL has been written to the free magnetic layer VL in a non-volatile manner.

In the data read operation, the access transistor ATR is turned ON in response to activation of the read word line RWL. As a result, a sense current Is flows through a current path formed from the bit line BL, tunnel magnetic resistive element TMR, access transistor ATR and ground voltage VSS. The sense current Is is supplied as a constant current from a not-shown control circuit.

The electric resistance value of the tunnel magnetic resistive element TMR varies according to the relative relation of the magnetic field direction between the fixed magnetic layer FL and the free magnetic layer VL. More specifically, when the fixed magnetic layer FL and the free magnetic layer VL have the same magnetic field direction, the tunnel magnetic resistive element TMR has a smaller electric resistance value as compared to the case where both magnetic layers have different magnetic field directions. The electric resistance values of the tunnel magnetic resistive element corresponding to the storage data "1" and "0" are herein indicated by R1 and R0, respectively (where R1>R0 and R1=R0+$\Delta$R).

The electric resistance value of the tunnel magnetic resistive element TMR thus varies according to an externally applied magnetic field. This enables data storage to be conducted based on the variation characteristics of the electric resistance value of the tunnel magnetic resistive element TMR. In general, the tunnel magnetic resistive element TMR that is applied to the MRAM devices has an electric resistance value in the range from about several kilo-ohms to about several tens of kilo-ohms.

A voltage change in the tunnel magnetic resistive element TMR due to the sense current Is varies depending on the magnetic field direction stored in the free magnetic layer VL. Therefore, by starting supply of the sense current Is with the bit line BL precharged to a high voltage, the storage data level in the MTJ memory cell can be read by monitoring a change in voltage level on the bit line BL.

FIG. 15 is a conceptual diagram illustrating the data write operation to the MTJ memory cell.

Referring to FIG. 15, in the data write operation, the read word line RWL is inactivated, so that the access transistor ATR is turned OFF. In this state, a data write current for writing a magnetic field to the free magnetic layer VL is supplied to the write word line WWL and the bit line BL. The magnetic field direction of the free magnetic layer VL is determined by combination of the respective directions of the data write currents flowing through the write word line WWL and the bit line BL.

FIG. 16 is a conceptual diagram illustrating the relation between the respective directions of the data write current and the magnetic field in the data write operation.

Referring to FIG. 16, a magnetic field Hx of the abscissa indicates the direction of a magnetic field H(BL) produced by the data write current flowing through the bit line BL. A magnetic field Hy of the ordinate indicates the direction of a magnetic field H(WWL) produced by the data write current flowing through the write word line WWL.

The magnet field direction stored in the free magnetic layer VL is updated only when the sum of the magnetic fields H(BL) and H(WWL) reaches the region outside the asteroid characteristic line shown in the figure. In other words, the magnetic field direction stored in the free magnetic layer VL is not updated when a magnetic field corresponding to the region inside the asteroid characteristic line is applied.

Accordingly, in order to update the storage data of the tunnel magnetic resistive element TMR by the data write operation, a current must be applied to both the write word line WWL and bit line BL. Once stored in the tunnel magnetic resistive element TMR, the magnetic field direction, i.e., the storage data, is retained therein in a nonvolatile manner until another data write operation is conducted.

The sense current Is flows through the bit line BL in the data read operation. However, the sense current Is is generally set to a value that is about one to two orders smaller than the data write current. Therefore, it is less likely that the storage data in the MTJ memory cell is erroneously rewritten by the sense current Is during the data read operation.

The aforementioned technical documents disclose the technology of forming an MRAM device, a random access memory, by integrating such MTJ memory cells on a semiconductor substrate.

FIG. 17 is a conceptual diagram showing the MTJ memory cells arranged in a matrix in an integrated manner.

Referring to FIG. 17, a highly integrated MRAM device can be realized by arranging the MTJ memory cells in a matrix on the semiconductor substrate. FIG. 17 shows the MTJ memory cells arranged in n rows by m columns (where n, m is a natural number). Herein, n write word lines WWL1 to WWLn, n read word lines RWL1 to RWLN, and m bit lines BL1 to BLm are provided for the n×m MTJ memory cells.

In the data read operation, one of the read word lines RWL1 to RWLn is selectively activated, so that the memory cells on the selected memory cell row (hereinafter, sometimes simply referred to as "selected row") are electrically coupled between the bit lines BL1 to BLm and the ground voltage VSS, respectively. As a result, the voltage on each bit line BL1 to BLm changes according to the storage data level in a corresponding memory cell.

Thus, the storage data level of the selected memory cell can be read by comparing the voltage on the bit line of the selected memory cell column (hereinafter, sometimes simply referred to as "selected column") with a prescribed reference voltage using a sense amplifier or the like.

A dummy memory cell is generally used to produce such a reference voltage. For example, a dummy resistance having an electric resistance value Rd corresponding to an intermediate value of the electric resistance values R1 and R0 can be used as a dummy memory cell for use in the data read operation from the MTJ memory cell. The electric resistance values R1 and R0 respectively correspond to the electric resistance values of the MTJ memory cell storing the data "1 (H level)" and "0 (L level)". The reference voltage can be produced by supplying the same sense current Is as that of the MTJ memory cell to the dummy resistance.

However, the data read operation requires the operation of charging and discharging a data line such as bit line to which a tunnel magnetic resistive element TMR having a relatively high electric resistance value is connected, thereby possibly mailing it difficult to increase the speed of the data read operation.

As described in the aforementioned technical documents, as a bias voltage applied to both ends of the magnetic tunnel junction, i.e., both ends of the tunnel magnetic resistive element TMR, is increased, a change in electric resistance value, ΔR, is reduced that corresponds to the relative relation of the magnetization direction between the fixed magnetic layer FL and the free magnetic layer VL, i.e., that corresponds to the storage data level. Therefore, as the voltage applied to both ends of the MTJ memory cell is increased in the data read operation, the voltage on the bit line does not noticeably change corresponding to the storage data level. This may possibly hinder the speed and stability of the data read operation.

Moreover, accuracy of the reference voltage is significantly affected by the electric resistance value of the dummy resistance in the dummy memory cell. Therefore, it is difficult to accurately set the reference voltage according to manufacturing variation.

SUMMARY OF THE INVENTION

It is an object of the present invention to provide a thin film magnetic memory device capable of high-speed, stable data read operation.

A thin film magnetic memory device according to the present invention includes a plurality of magnetic memory cells, a first data line, a first precharging circuit, a first read driving circuit, and a first charge transfer feedback amplifier portion, and an amplifier portion. Each of the plurality of magnetic memory cells has its electric resistance value varying according to a storage data level written therein by an applied magnetic field. The first data line is electrically coupled to a first voltage through a selected one of the plurality of magnetic memory cells in data read operation. The first precharging circuit sets the first data line to a precharge voltage before the data read operation. The first read driving circuit supplies a data read current to the first data line in the data read operation. The first charge transfer feedback amplifier portion is provided between the first data line and a first internal node, for retaining a voltage on the first data line and producing a first output voltage onto the first internal node according to an integral value of the data read current flowing through the first data line. The amplifier portion produces read data based on the voltage on the first internal node.

Preferably, the precharge voltage is the first voltage, and the first read driving circuit couples the first data line to a second voltage in the data read operation.

Preferably, the first charge transfer feedback amplifier portion includes an operational amplifier for amplifying a voltage difference between first and second input nodes to produce the first output voltage onto the first internal node, a charge transfer portion coupled between the first data line and the first input node, for transmitting a voltage change on the first data line due to the data read current to the first input node, and a charge feedback portion coupled between the first internal node and the first data line, for supplying charges according to a change in the first output voltage so as to cancel the voltage change on the first data line from the first voltage. The precharge voltage is applied to the second input node.

Preferably, the plurality of magnetic memory cells are arranged in a matrix. The thin film magnetic memory device further includes: a plurality of word lines provided respectively corresponding to magnetic memory cell rows; a plurality of bit lines provided respectively corresponding to magnetic memory cell columns; and a column selection portion for connecting one of the plurality of bit lines that is electrically coupled to the selected magnetic memory cell to the first data line.

Alternatively, the thin film magnetic memory device preferably further includes: a dummy memory cell having an intermediate electric resistance value of two electric resistance values of each magnetic memory cell, the two electric resistance values respectively corresponding to two storage data levels; a second data line electrically coupled to the first voltage through the dummy memory cell in the data read operation; a second precharging circuit for setting the second data line to the precharge voltage before the data read operation; a second read driving circuit for supplying a data read current to the second data line in the data read operation; and a second charge transfer feedback amplifier portion provided between the second data line and a second internal node, for retaining a voltage on the second data line and producing a second output voltage onto the second internal node according to an integral value of the data read current flowing through the second data line. The amplifier portion produces the read data according to a voltage difference between the first and second internal nodes.

In particular, the precharge voltage is the first voltage, and the first and second read driving circuits respectively couple the first and second data lines to a second voltage in the data read operation.

Preferably, the thin film magnetic memory device further includes: a dummy memory cell having an intermediate electric resistance value of two electric resistance values of each magnetic memory cell, the two electric resistance values respectively corresponding to two storage data levels; a second data line electrically coupled to the first voltage through the dummy memory cell in the data read operation; a second precharging circuit for setting the second data line to the precharge voltage before the data read operation; a second read driving circuit for supplying the data read current to the second data line in the data read operation; a second charge transfer feedback amplifier portion provided between the second data line and a second internal node, for maintaining a voltage on the second data line and producing a second output voltage onto the second internal node according to an integral value of the data read current flowing through the second data line; and a charge feedback portion coupled between the second internal node and the first data line, for feeding back with a reversed polarity a change in the second output voltage to the first data line.

In particular, the precharge voltage is the first voltage, and the first and second read driving circuits respectively couple the first and second data lines to a second voltage in the data read operation.

Such a thin film magnetic memory device enables suppression of a bias voltage that is applied to both ends of the selected magnetic memory cell in the data read operation. Accordingly, a change in electric resistance value in the magnetic memory cell according to the storage data level is more likely to appear, allowing for improved speed and stability of the data read operation.

Moreover, providing the bit lines and the first data line in a hierarchical manner enables a plurality of magnetic memory cells arranged in a matrix to share the circuitry associated with the data read operation.

Furthermore, the data read operation is conducted based on comparison between the dummy memory cell and the selected magnetic memory cell. Therefore, the data read operation can be accurately conducted within a margin of the timing of sensing the first output voltage from the first charge transfer feedback amplifier portion, thereby allowing for further stabilized data read operation. In particular, the voltage difference between the first and second data lines is amplified to produce the first output voltage through the charge feedback portion, thereby allowing for simplified circuit structure of the amplifier portion for producing the data.

A thin film magnetic memory device according to another aspect of the present invention includes a plurality of magnetic memory cells, a first data line, a dummy memory cell, a second data line, and a data read circuit. Each of the plurality of magnetic memory cells stores data written by an applied magnetic field. Each magnetic memory cell includes a magnetic storage portion having one of a first electric resistance value and a second electric resistance value that is larger than the first electric resistance value, according to a level of the storage data, and a memory cell selection gate connected in series with the magnetic storage portion, and rendered conductive when selected. The first data line is electrically coupled to the magnetic storage portion and the conductive memory cell selection gate of a selected magnetic memory cell and receives a data read current in data read operation. The dummy memory cell has an intermediate electric resistance value of the first and second electric resistance values. The dummy memory cell includes a dummy resistance portion having the first electric resistance value, and a dummy memory cell selection gate connected in series with the dummy resistance portion, and rendered conductive when selected. The second data line is electrically coupled to the dummy resistance portion and the conductive dummy memory cell selection gate and receives the data read current in the data read operation. The data read circuit produces read data based on a voltage change on the first and second data lines. An electric resistance value of the conductive dummy memory cell selection gate is larger than a third electric resistance value and is smaller than a sum of a difference between the second and first electric resistance values and the third electric resistance value. The third electric resistance value is an electric resistance value of the conductive memory cell selection gate.

Preferably, each of the memory cell selection gates includes a first field effect transistor, and the dummy memory cell selection gate includes a second field effect transistor having at least one of its gate width and gate length being different from that of the first field effect transistor.

Alternatively, each of the memory cell selection gates preferably includes a first field effect transistor, and the dummy memory cell selection gate preferably includes a second field effect transistor having the third electric resistance value when rendered conductive, and a third field effect transistor connected in series with the second field effect transistor and having an electric resistance value smaller than the difference when rendered conductive. The second field effect transistor is designed in common with the first field effect transistor.

Preferably, the dummy resistance portion includes a magnetic storage portion for storing a data level corresponding to the first electric resistance value. The magnetic storage portion included in the dummy resistance portion has a same structure as that of the magnetic storage portion included in each magnetic memory cell.

Such a thin film magnetic memory device enables the magnetic storage portion in the magnetic memory cell and the dummy resistance portion in the dummy memory cell to be formed on the same array by using the magnetic storage portions of common design. Accordingly, the electric resistance value of the dummy memory cell can be appropriately set while allowing manufacturing variation. As a result, a read operation margin can be ensured regardless of the manufacturing variation.

A thin film magnetic memory device according to a further aspect of the present invention includes a plurality of magnetic memory cells, a dummy memory cell, a first data line, a second data line, a data read circuit, and a dummy resistance adding circuit. Each of the plurality of magnetic memory cells stores data written by an applied magnetic field. The dummy memory cell is compared with a selected one of the plurality of magnetic memory cells in data read operation. Each of the magnetic memory cells and the dummy memory cell include a magnetic storage portion having one of a first electric resistance value and a second electric resistance value that is larger than the first electric resistance value, according to a level of the storage data, and a memory cell selection gate connected in series with the magnetic storage portion, and rendered conductive when selected. The magnetic storage portion included in the dummy memory cell stores data at a level corresponding to the first electric resistance value. The first data line is electrically coupled to one of the selected magnetic memory cell and the dummy memory cell in the data read operation. The second data line is electrically coupled to the other of the selected magnetic memory cell and the dummy memory cell in the data read operation. The data read circuit supplies a data read current to each of the first and second data lines and produces read data based on a voltage change on the first and second data lines. The dummy resistance adding circuit selectively connects a resistance portion in series with one of the first and second data lines that is electrically coupled to the dummy memory cell. The resistance portion has an electric resistance value smaller than a difference between the first and second electric resistance values.

Preferably, the resistance portion includes a field effect transistor receiving a variable control voltage at its gate.

Alternatively, the dummy resistance adding circuit preferably selects one of the first and second data lines to which the resistance portion is connected, according to a part of a row address.

Such a thin film magnetic memory device enables the magnetic memory cell and the dummy memory cell to have the same structure. Accordingly, a read operation margin can be ensured according to manufacturing variation of the magnetic memory cells.

Moreover, the resistance value of the resistance portion that is connected in series with the dummy memory cell can be adjusted according to the variable control voltage. Therefore, a read operation margin can be ensured according to manufacturing variation of the difference between the electric resistance values of the magnetic storage portion that corresponds to the difference in storage data level.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
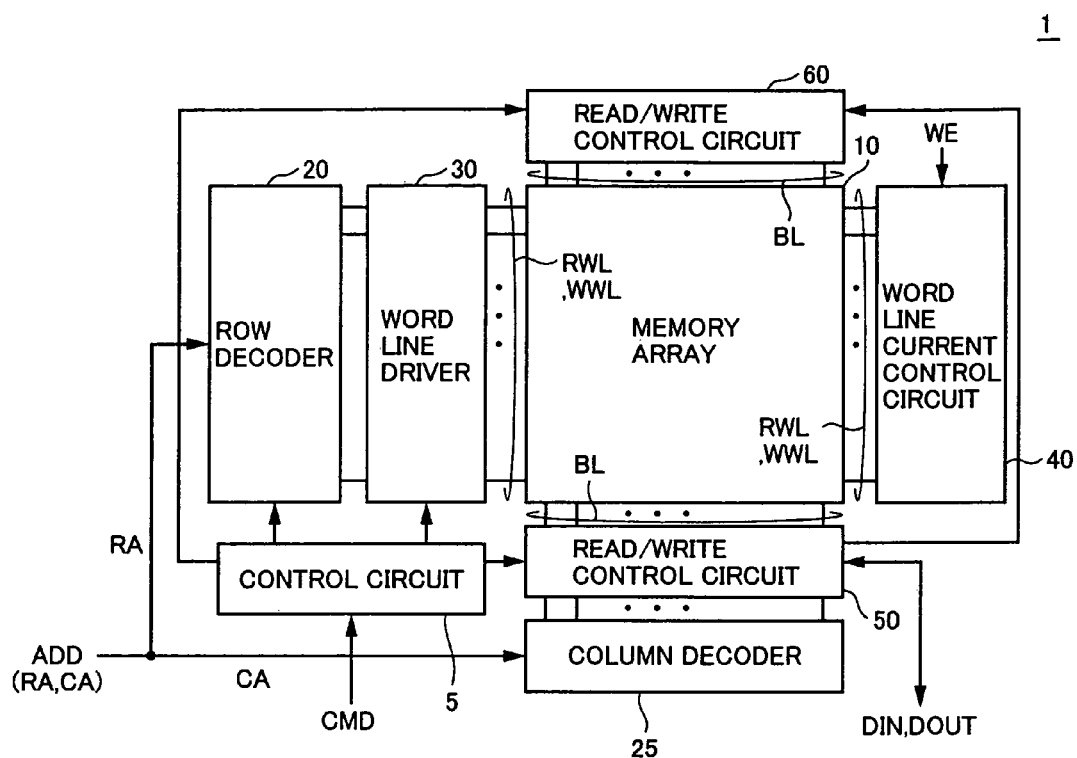
FIG. 1 is a schematic block diagram showing the overall structure of an MRAM device according to a first embodiment of the present invention.

Hereinafter, embodiments of the present invention will be described in detail with reference to the accompanying drawings. Note that the same reference numerals and characters denote the same or corresponding portions in the following description.

First Embodiment

Referring to FIG. 1, an MRAM device 1 according to a first embodiment of the present invention conducts random access in response to an external control signal CMD and address signal ADD, thereby receiving write data DIN and outputting read data DOUT.

The MRAM device 1 includes a control circuit 5 for controlling the overall operation of the MRAM device 1 in response to the control signal CMD, and a memory array 10 having a plurality of MTJ memory cells arranged in a matrix. Although the structure of the memory array 10 will be specifically described below, a plurality of write word lines WWL and a plurality of read word lines RWL are provided respectively corresponding to the MTJ memory cell rows. Bit lines BL are provided respectively corresponding to the MTJ memory cell columns.

The MRAM device 1 further includes a row decoder 20, a column decoder 25, a word line driver 30, a word line current control circuit 40 and read/write control circuits 50, 60.

The row decoder 20 conducts row selection in the memory array 10 according to a row address RA indicated by the address signal ADD. The column decoder 25 conducts column selection in the memory array 10 according to a column address CA indicated by the address signal ADD.

The word line driver 30 selectively activates the read word line RWL or the write word line WWL according to the row selection result of the row decoder 20. The row address RA and the column address CA together indicate a memory cell selected for the data read or write operation.

The word line current control circuit 40 applies a data write current to the write word line WWL in the data write operation. For example, the word line current control circuit 40 couples each write word line WWL to the ground voltage VSS, so that the data write current can be applied to the write word line WWL selectively coupled to the power supply voltage VDD by the word line driver 30. The read/write control circuit 50, 60 correctively refers to the circuitry provided in a region adjacent to the memory array 10, for applying a data write current and a sense current (data read current) to a bit line in the data read and write operations, respectively.

Figure 2:
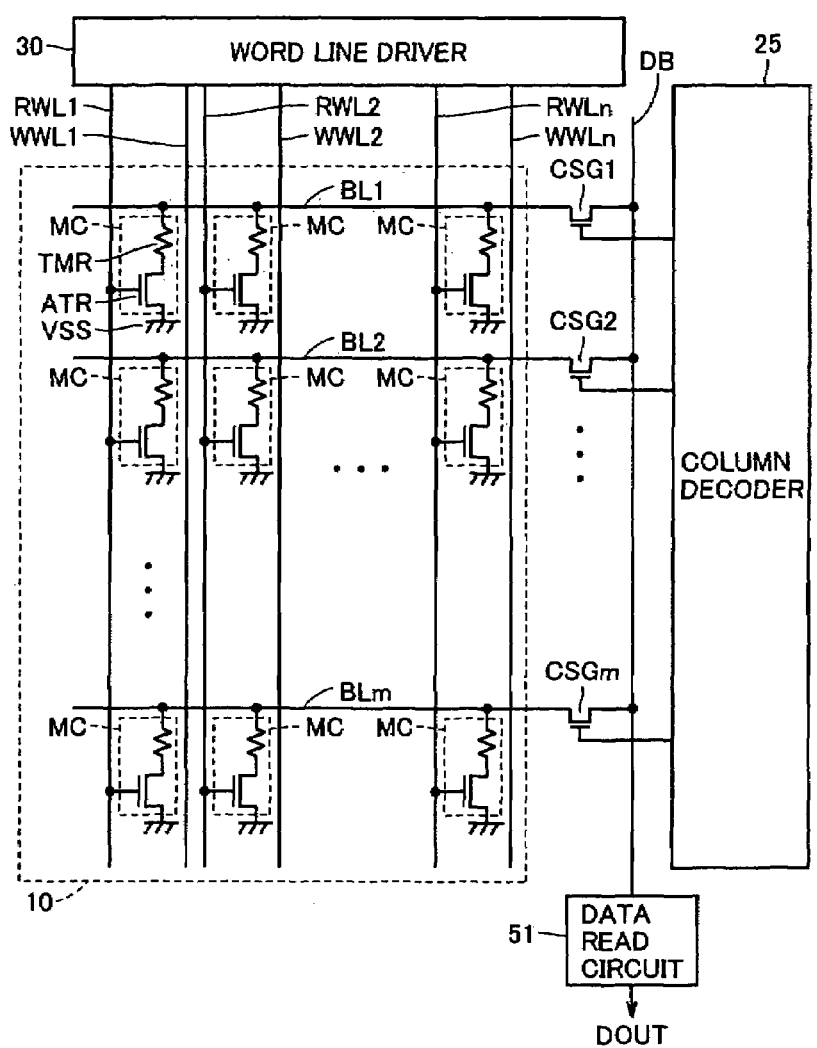
FIG. 2 is a diagram showing the structure of a memory array and its peripheral circuitry according to the first embodiment.

FIG. 2 primarily shows the structure associated with the data read operation in the memory array 10 and its peripheral circuitry.

Figure 13:
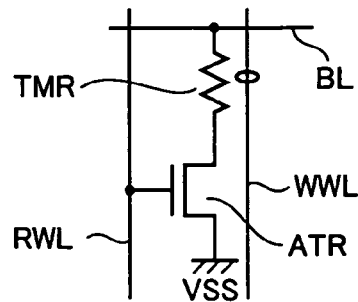
FIG. 13 is a schematic diagram showing the structure of a memory cell having a magnetic tunnel junction.
Figure 14:
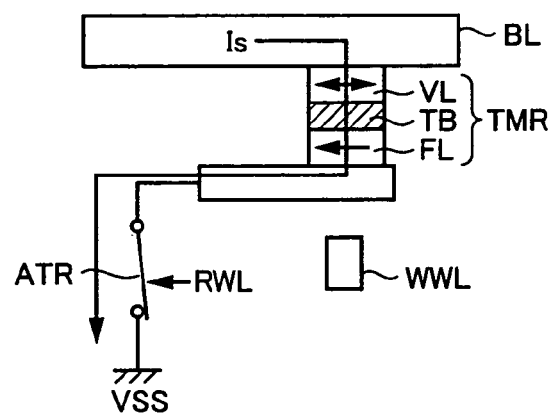
FIG. 14 is a conceptual diagram illustrating the data read operation from the MTJ memory cell.
Figure 15:
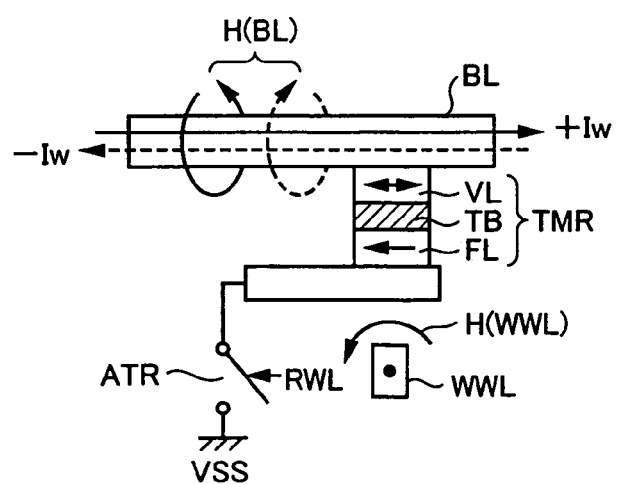
FIG. 15 is a conceptual diagram illustrating the data write operation to the MTJ memory cell.
Figure 16:
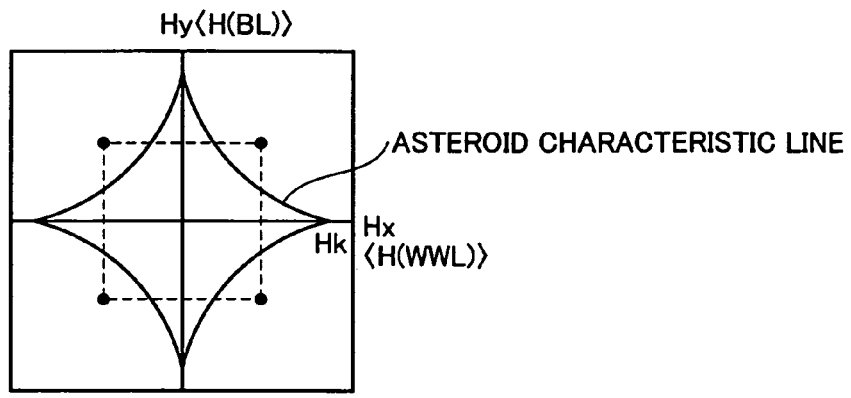
FIG. 16 is a conceptual diagram illustrating the relation between the direction of a data write current and the magnetization direction in the data write operation.
Figure 17:
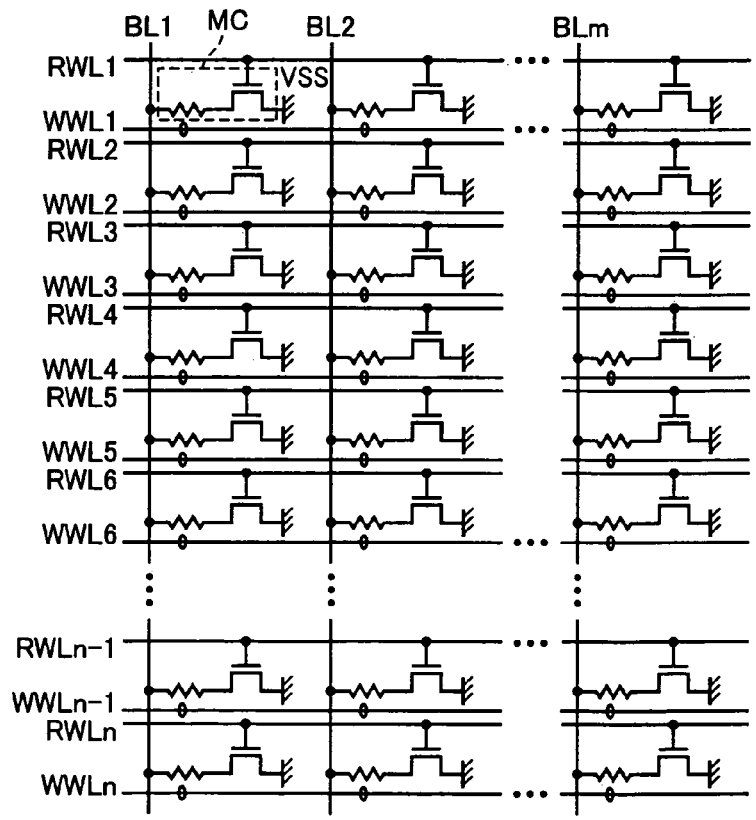
FIG. 17 is a conceptual diagram showing the MTJ memory cells arranged in a matrix in an integrated manner.

Referring to FIG. 2, the memory array 10 includes MTJ memory cells MC (hereinafter, sometimes simply referred to as "memory cells MC") arranged in n rows by m columns. Each memory cell MC has the structure shown in FIG. 13. Read word lines RWL1 to RWLn and write word lines WWL1 to WWLn are provided respectively corresponding to the MTJ memory cell rows (hereinafter, sometimes simply referred to as "memory cell rows"). Bit lines BL1 to BLm are provided respectively corresponding to the MTJ memory cell columns (hereinafter, sometimes simply referred to as "memory cell columns").

FIG. 2 exemplarily shows the write word lines WWL1, WWL2, WWLn, read word lines RWL1, RWL2, RWLn, bit lines BL1, BL2, BLm, and some memory cells corresponding to the first, second and nth rows and the first, second and mth columns.

Hereinafter, the write word lines, read word lines and bit lines are sometimes generally denoted with WWL, RWL and BL, respectively. A specific write word line, read word line and bit line are denoted with, e.g., RWL1, WWL1 and BL1, respectively. The high voltage state (power supply voltage VDD) and low voltage state (ground voltage VSS) of a signal or a signal line are sometimes referred to as H level and L level, respectively.

In the data read operation, the word line driver 30 activates one of the read word lines RWL1 to RWLN to H level according to the decode result of the row address RA, i.e., the row selection result. In response to this, the respective access transistors ATR of the memory cells MC on the selected memory cell row are turned ON, whereby the respective tunnel magnetic resistive elements TMR of the memory cells MC are electrically coupled between the corresponding bit lines BL and the source voltage. FIG. 1 exemplarily shows the case where the source voltage is set to the ground voltage VSS.

A data bus DB is provided in a region adjacent to the memory array 10 so as to extend in the same direction as that of the read word line RWL and write word line WWL. Column selection lines CSL1 to CSLm for conducting column selection are provided respectively corresponding to the memory cell columns. In the data read operation, the column decoder 25 activates one of the column selection lines CSL1 to CSLm to H level according to the decode result of the column address CA, i.e., the column selection result.

Column selection gates CSG1 to CSGm are respectively provided between the data bus DB and the bit lines BL1 to BLm. Each column selection gate is turned ON in response to activation of a corresponding column selection line. Accordingly, the data bus DB is electrically coupled to the bit line of the selected memory cell column.

Note that the column selection lines CSL1 to CSLm and the column selection gates CSG1 to CSGm are sometimes generally referred to as column selection line CSL and column selection gate CSG, respectively.

A data read circuit 51 outputs read data DOUT according to a voltage on the data bus DB.

Figure 3:
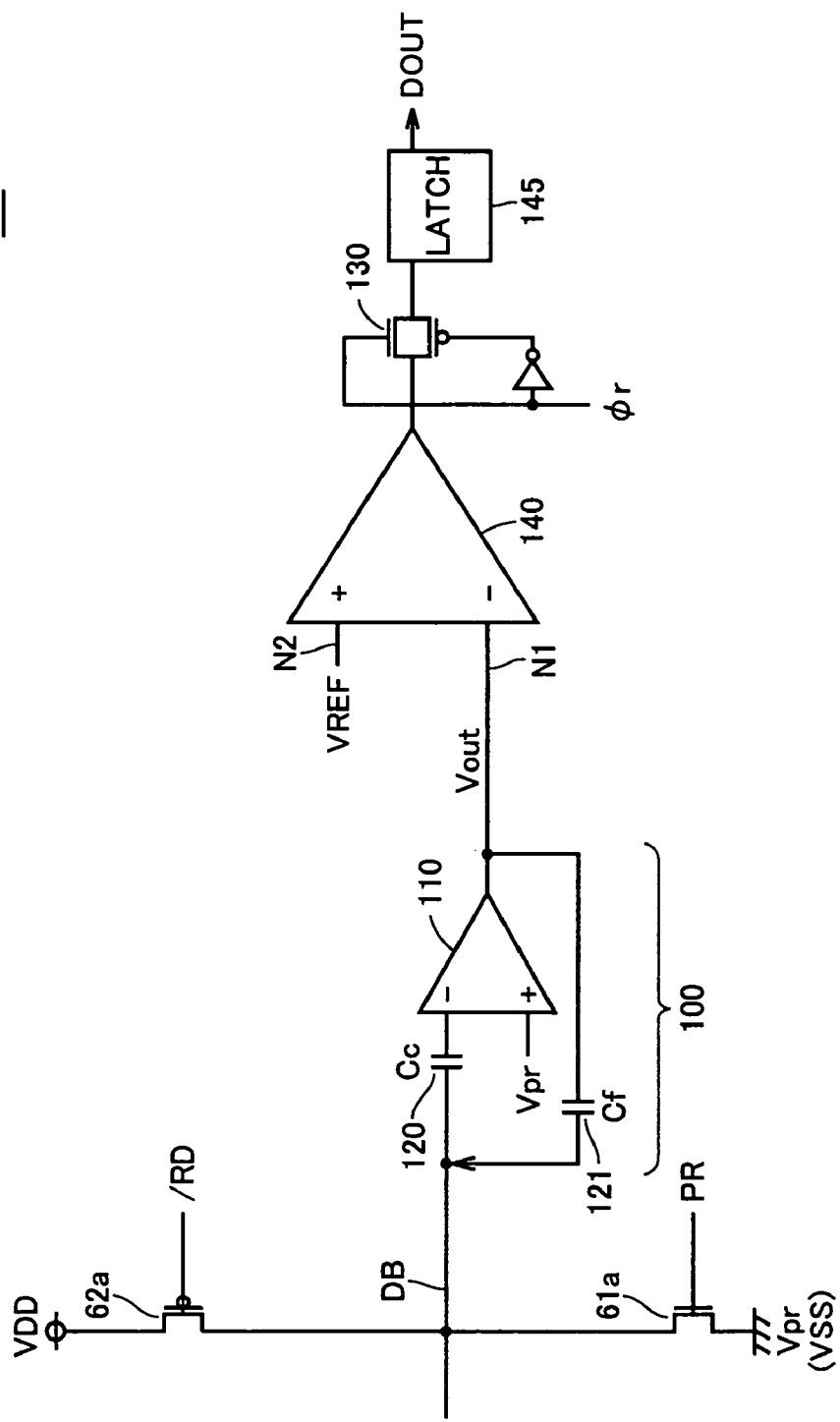
FIG. 3 is a circuit diagram showing the structure of a data read circuit of FIG. 2.

Referring to FIG. 3, the data read circuit 51 includes a precharging transistor 61a, a driving transistor 62a, a charge transfer feedback amplifier portion 100, a transfer gate 130, a differential amplifier 140, and a latch circuit 145.

The precharging transistor 61a is electrically coupled between a precharge voltage Vpr and the data bus DB, and is turned ON/OFF according to a control signal PR. The control signal PR is rendered active for the precharging period of the data bus DB. In the active period of the MRAM device 1, the control signal PR is activated to L level at least for a prescribed period before data read operation. During data read operation in the active period of the MRAM device 1, the control signal PR is inactivated to L level.

Although not shown in the figure, the same precharging transistor is provided for every bit line BL, so that each bit line BL is precharged to the precharge voltage Vpr in response to activation of the control signal PR. The precharge voltage Vpr is set in view of the source voltage to which the memory cell MC is coupled. In the present embodiment, the precharge voltage Vpr is set to the ground voltage VSS like the source voltage. Thus, in the precharging period during which the control signal PR is activated to H level, the data bus DB and the bit lines BL are precharged to the ground voltage VSS. In the data read operation, the control signal PR is inactivated to L level, so that the data bus DB is disconnected from the precharge voltage (ground voltage VSS). Accordingly, at the start of the data read operation, a bias voltage applied to both ends of the tunnel magnetic resistive element TMR in each memory cell MC is 0 V.

The driving transistor 62a is electrically coupled between a driving voltage and the data bus DB, and is turned ON/OFF according to a control signal /RD. The control signal /RD is rendered active for a prescribed period after the start of the data read operation, but is rendered inactive in the other periods. The driving voltage is set to a level different from that of the source voltage to which the memory cell MC is coupled. In the present embodiment, the driving voltage is set to the power supply voltage VDD.

When the data read operation is started, the data bus DB precharged to the ground voltage VSS is disconnected from the ground voltage VSS (precharge voltage Vpr), and coupled to the power supply voltage VDD (driving voltage). As a result, a sense current Is corresponding to the data read current flows through a path formed from the power supply voltage VDD (driving voltage), data bus DB, bit line of the selected column, selected memory cell, and ground voltage VSS (source voltage).

The charge transfer feedback amplifier portion 100 is provided between the data bus DB and a node N1, and includes an operational amplifier 110 and capacitors 120, 121.

The precharge voltage Vpr is applied to one input node of the operational amplifier 110. The other input node of the operational amplifier 110 is electrically coupled to the data bus DB through the capacitor 120. The capacitor 120 (Cc) is electrically coupled between the node N1 and the data bus DB. The capacitor 120 functions as a charge transfer portion for transmitting a voltage change on the data bus DB due to the sense current Is to the other input node of the operational amplifier 110.

In the precharging period before data read operation, the data bus DB is set to the precharge voltage Vpr. Therefore, the input voltage difference of the operational amplifier 110 is zero. At this time, an output voltage Vout of the operational amplifier 110, i.e., a voltage at the node N1, is equal to the power supply voltage VDD.

In the data read operation, the level of the sense current Is varies according to the storage data level in the selected memory cell. The operational amplifier 110 receives through the capacitor 120 an inverted value of the voltage change on the data bus DB due to the sense current Is. The operational amplifier 110 then calculates an integral value of the voltage change on the data bus DB to produce an output voltage Vout. The change rate of the output voltage Vout depends on the sense current Is. Therefore, the storage data level in the selected memory cell can be sensed from the output voltage Vout after a prescribed time-period from the start of the data read operation.

The capacitor 121 (Cf) is coupled between the node N1 and the data bus DB. The capacitor 121 functions as a charge feedback portion for supplying charges according to the voltage change on the node N1 so as to cancel the voltage change on the data bus DB from the precharge voltage Vpr.

Accordingly, the capacitor 121 feeds back the change in output voltage Vout to the data bus DB, so that the voltage on the data bus DB is retained at the precharge voltage Vpr as before data read operation. This enables suppression of the bias voltage that is applied to both ends of the tunnel magnetic resistive element TMR in the selected memory cell.

Thus, the charge transfer feedback amplifier portion 100 produces the output voltage Vout according to an integral value of the sense current Is flowing through the data bus DB, while retaining the voltage on the data bus DB at the precharge voltage.

The differential amplifier 140 amplifies the voltage difference between the nodes N1 and N2 to produce read data DOUT. A prescribed reference voltage VREF is applied to the node N2. Thus, the differential amplifier 140 amplifies the difference between the output voltage Vout of the operational amplifier 110 and the reference voltage VREF for output.

The transfer gate 130 operates in response to a trigger pulse φr. In response to the activation period of the trigger pulse φr, the transfer gate 130 transmits the output of the differential amplifier 140 to the latch circuit 145. The latch circuit 145 outputs the latched output voltage of the differential amplifier 140 as read data DOUT.

Figure 4:
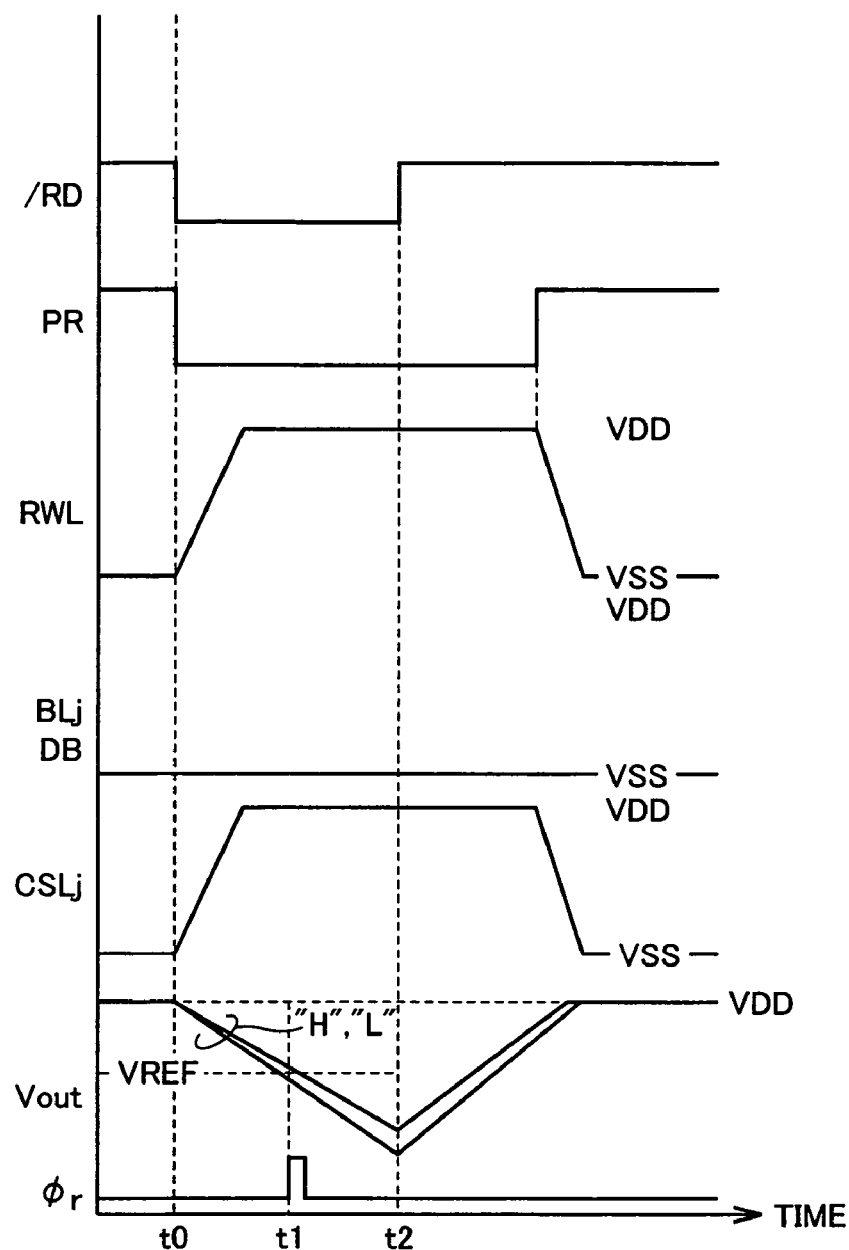
FIG. 4 is a timing chart illustrating the data read operation according to the first embodiment.

Hereinafter, the data read operation of the first embodiment will be described with reference to FIG. 4. FIG. 4 shows the case where the jth memory cell column is selected for data read operation (where j is a natural number of 1 to m).

Referring to FIG. 4, the data read operation is started at time t0. Before time t0, every read word line RWL and column selection line CSL are rendered inactive (L level).

In this period, the precharge control signal PR is rendered active (H level) and the control signal /RD is rendered inactive (H level). Therefore, the data bus DB is precharged to the ground voltage VSS (precharge voltage). As described before, each bit line BL is also precharged to the ground voltage VSS (precharge voltage).

At time t0, the data read operation is started, and the control signal /RD is activated to L level for a prescribed period until time t2. The precharge control signal PR is inactivated to L level. In response to this, the bit lines BL and the data bus DB are disconnected from the precharge voltage (ground voltage VSS) and coupled to the driving voltage (power supply voltage VDD) in the data read operation.

The word line driver 30 activates the read word line of the selected row to H level. As a result, the memory cells on the selected row are electrically coupled between the respective bit lines BL and the source voltage. The remaining read word lines of the non-selected rows are retained at L level.

Moreover, the column selection line CSLj of the selected column is selectively activated to H level. In response to this, the bit line of the selected column is electrically coupled to the data bus DB. Accordingly, the sense current Is according to the electric resistance value of the selected memory cell flows through a current path formed from the data bus DB (driven to the power supply voltage VDD), bit line BLj, selected memory cell and source voltage (ground voltage VSS).

Although not shown in the figure, the remaining column selection lines of the non-selected columns are retained at L level. Therefore, the bit lines BL of the non-selected columns are retained at the precharge voltage. Since the precharge voltage of the bit lines BL is the same as the source voltage of the memory cells MC, an unnecessary charging/discharging current can be prevented from flowing through the bit lines BL of the non-selected columns.

The change rate of the output voltage Vout from the charge transfer feedback amplifier portion 100 varies according to the storage data level in the selected memory cell. Therefore, the storage data level in the selected memory cell can be read by sensing the output voltage Vout at fixed timing from the start of the data read operation.

At time t1, i.e., after a prescribed time has passed from the start of the data read operation, the trigger pulse φr is activated (H level) as a one-shot pulse. The data read circuit 51 amplifies the difference between the output voltage Vout and the reference voltage VREF to produce read data DOUT. The reference voltage VREF is set to an intermediate value of two output voltages Vout at time t1, which respectively correspond to the case where the storage data is at H level and L level.

The charge transfer feedback amplifier portion 100 retains the data bus DB and the bit line BLj of the selected column at the precharge voltage (ground voltage VSS) as before the data read operation. This enables suppression of the bias voltage that is applied to both ends of the tunnel magnetic resistive element TMR of the selected memory cell in the data read operation. Accordingly, a change in electric resistance value in each memory cell according to the storage data level is more likely to appear, allowing for improved speed and stability of the data read operation.

First Modification of First Embodiment

The structure including dummy memory cells DMC for producing the reference voltage VREF for use in the data read circuit will be described in the first modification of the first embodiment.

Figure 5:
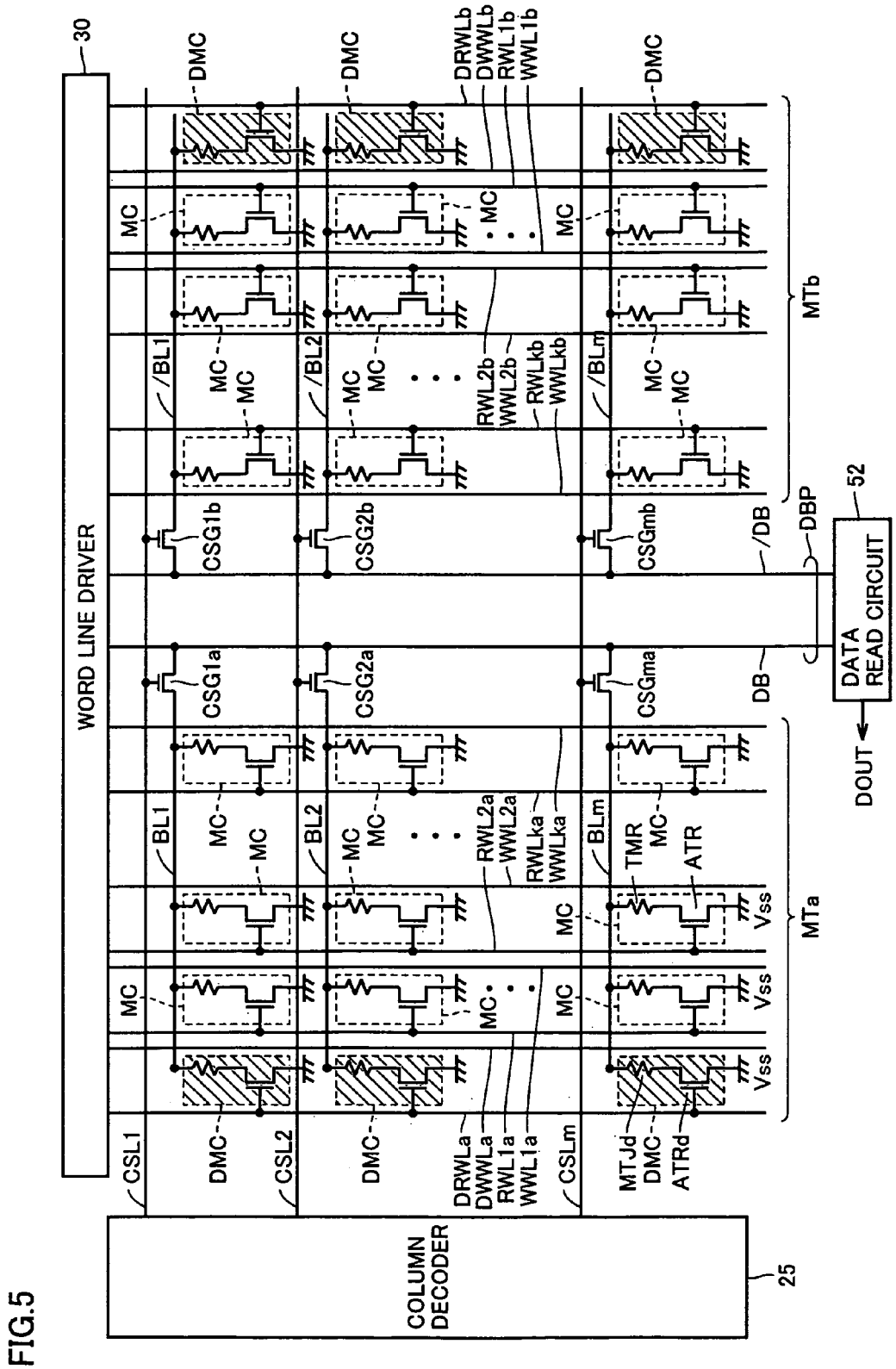
FIG. 5 is a conceptual diagram showing the structure of a memory array and its peripheral circuitry according to a first modification of the first embodiment.

Referring to FIG. 5, in the first modification of the first embodiment, the memory array 10 is divided into two memory mats MTa and MTb in the row direction. In each memory mat MTa, MTb, read word lines RWL and write word lines WWL are provided respectively corresponding to the memory cell rows, and bit lines are provided respectively corresponding to the memory cell columns.

In each memory mat MTa, MTb, m bit lines are provided according to a so-called open bit line structure. In FIG. 5, the bit lines in one memory mat MTa are denoted with BL1 to BLm, whereas the bit lines in the other memory mat MTb are denoted with /BL1 to /BLm. The bit lines BL1 to BLm and /BL1 to /BLm are sometimes generally referred to as bit lines BL and /BL, respectively.

In each memory cell row, the memory cells MC are electrically coupled between the respective bit lines and the source voltage. As in the first embodiment, the source voltage is set to the ground voltage VSS.

Column selection gates CSG1a to CSGma are provided respectively corresponding to the bit lines BL1 to BLm of the memory mat MTa. Similarly, column selection gates CSG1b to CSGmb are provided respectively corresponding to the bit lines /BL1 to /BLm of the memory mat MTb. The respective column selection gates of the same memory cell column in the memory mats Ma and Mb are controlled by a corresponding common column selection line CSL.

In each memory mat MTa, MTb, a plurality of dummy memory cells DMC are arranged in a single dummy row. A plurality of dummy memory cells DMC in the memory mat MTa are respectively provided between the bit lines BL1 to BLm and the source voltage (ground voltage VSS). A plurality of dummy memory cells DMC in the memory mat MTb are respectively provided between the bit lines /BL1 to /BLm and the source voltage (ground voltage VSS).

Each dummy memory cell DMC includes a dummy resistance MTJd and a dummy access transistor ATRd that are connected in series between a corresponding bit line BL and the source voltage (ground voltage VSS). The dummy resistance MTJd has an electric resistance value Rd corresponding to an intermediate value of electric resistance values R1 and R0 of the memory cell MC. The memory cell MC has the electric resistance value R1 when H level data is stored therein, and has the electric resistance value R0 when L level data is stored therein.

In the memory mat MTa, read word lines RWL1a to RWLka and write word lines WWL1a to WWLka (where k is an integer given by n/2) are provided respectively corresponding to the memory cell rows. A dummy read word line DRWLa and a dummy write word line DWWLa are also provided corresponding to the dummy row. Note that, although the magnetic data write operation is not necessarily required for the dummy memory cell DMC, it is desired to provide the dummy write word line DWWLa in order to ensure continuity of the shape with the memory cell region.

Similarly, in the memory mat MTb, read word lines RWL1b to RWLkb and write word lines WWL1b to WWLkb are provided respectively corresponding to the memory cell rows. A dummy read word line DRWLb and a dummy write word line DWWLb are also provided corresponding to the dummy row.

The dummy read word line DRWLa, DRWLb is activated in the non-selected memory block that does not include the memory cell selected for the data read operation. In the selected memory block including the selected memory cell, a read word line RWL is activated according to the row selection result.

For example, when the selected memory cell is located on the ith row of the memory mat MTa (where i is a natural number), the read word line RWLia is activated (H level) and the dummy read word line DRWLa is retained inactive (L level) in the selected memory mat MTa. In the non-selected memory mat MTb, the dummy read word line DRWLb is activated, whereas every read word line RWL1b to RWLkb is retained inactive (L level).

On the contrary, when the selected memory cell is located on the ith row of the memory mat MTb, the read word line RWLib is activated (H level) and the dummy read word line DRWLb is retained inactive (L level) in the selected memory mat MTb. In the non-selected memory mat MTa, the dummy read word line DRWLa is activated, whereas every read word line RWL1a to RWLka is retained inactive (L level).

As a result, the memory cell MC is electrically coupled to the bit line of the selected column in the selected memory mat, whereas the dummy memory cell DMC is electrically coupled to the bit line of the selected column in the non-selected memory mat.

A data bus /DB that is complementary to the data bus DB is also provided to form a data bus pair DBP with the data bus DB. The bit lines BL and /BL of the selected column are electrically coupled to the data buses DB and /DB through corresponding column selection gates, respectively.

A data read circuit 52 outputs the read data DOUT according to the voltages on the data buses DB and /DB.

Figure 6:
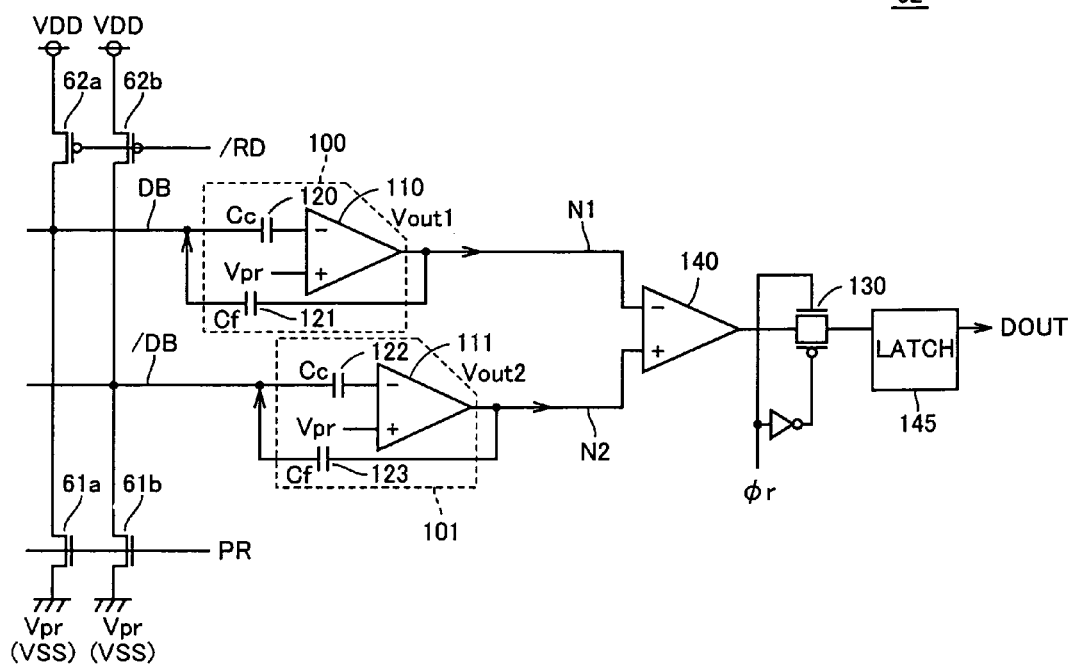
FIG. 6 is a circuit diagram showing the structure of a data read circuit of FIG. 5.

Referring to FIG. 6, the data read circuit 52 is different from the data read circuit 51 in that the data read circuit 52 further includes a precharging transistor 61b, a driving transistor 62b and a charge transfer feedback amplifier portion 101 for the data bus /DB.

The precharging transistor 61b and the driving transistor 62b operate in the same manner as that of the precharging transistor 61a and the driving transistor 62a. Accordingly, before (precharging period) and during data read operation, the voltage on the data bus /DB is set to the same value as that of the voltage on the data bus DB.

The charge transfer feedback amplifier portion 101 has the same structure as that of the charge transfer feedback amplifier portion 100, and is provided between the data bus /DB and the node N2. The charge transfer feedback amplifier portion 101 includes an operational amplifier 111 and capacitors 122, 123.

The precharge voltage Vpr is applied to one input node of the operational amplifier 111. The other input node of the operational amplifier 111 is electrically coupled to the data bus /DB through the capacitor 122 (Cc). The capacitor 123 (Cf) is electrically coupled between the node N2 and the data bus /DB. The capacitor 122 has the same function as that of the capacitor 120, and the capacitor 123 has the same function as that of the capacitor 121.

Note that the capacitance ratio between the capacitors 122 and 123 must be designed to the same value as the capacitance ratio between the capacitors 120 and 121. As long as this capacitance ratio is obtained, the capacitors 120, 122 and the capacitors 121, 123 need not be designed to have the same capacitance value Cc or Cf.

The charge transfer feedback amplifier portion 101 produces an output voltage Vout2 according to an integral value of the sense current Is flowing through the data bus /DB, while retaining the data bus /DB at the precharge voltage.

The differential amplifier 140 amplifies the difference between the output voltages Vout1 and Vout2 from the charge transfer feedback amplifier portions 100 and 101 to produces read data DOUT. Since the structure of the data read circuit 52 is otherwise the same as that of the data read circuit 51 of FIG. 3, detailed description thereof will not be repeated.

Thus, the reference voltage VREF of the first embodiment can be produced using the dummy memory cell. Therefore, in addition to the structure of the first embodiment, the data read operation can be accurately conducted within a margin of the voltage sensing timing in the data read circuit 52, i.e., the activation timing of the trigger pulse φr. In other words, a read operation margin can be ensured even if the voltage sensing timing in the data read circuit varies.

Second Modification of First Embodiment

A simplified structure of the data read circuit will be described in the second modification of the first embodiment.

Figure 7:
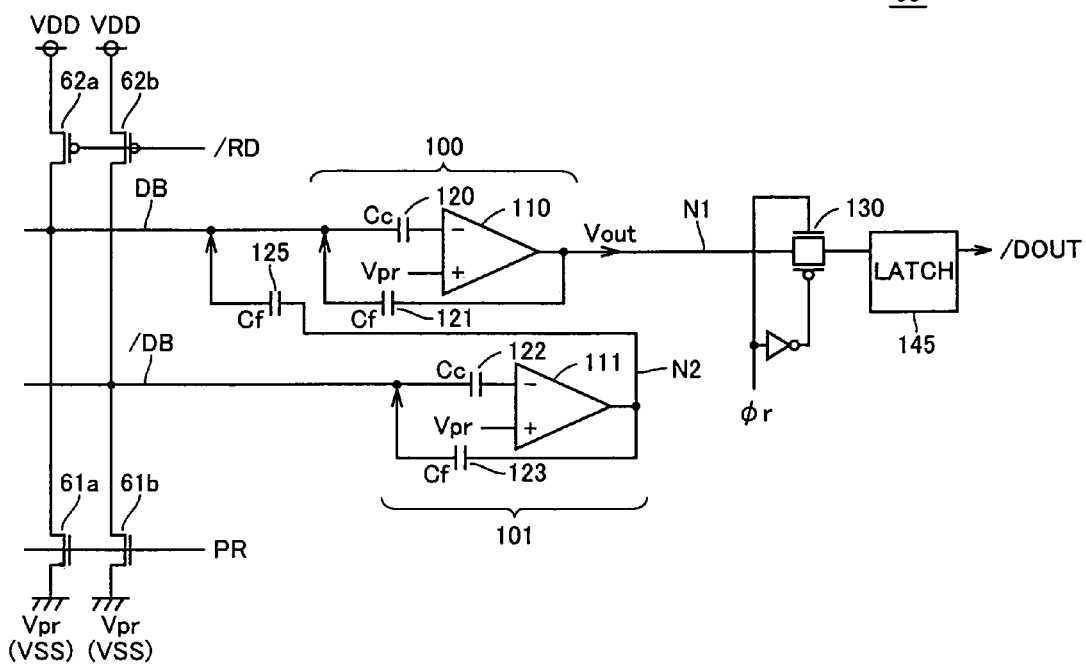
FIG. 7 is a circuit diagram showing the structure of a data read circuit according to a second modification of the first embodiment.

Referring to FIG. 7, a data read circuit 53 of the second modification of the first embodiment is different from the data read circuit 52 in that the data read circuit 53 further includes a feedback capacitor 125 between the nodes N1 and N2, and the differential amplifier 140 is eliminated.

The capacitors 120, 122 are designed to have a capacitance value Cc, and the capacitors 121, 123 and the feedback capacitor 125 are designed to have a capacitance value Cf. The feedback capacitor 125 feeds back with a reversed polarity a voltage change corresponding to an integral value of the sense current Is flowing through the data bus /DB to the data bus DB. The voltage change thus negatively fed back to the data bus DB is applied to the operational amplifier 110 through the capacitor 120. Thus, the data read circuit 53 outputs an output voltage Vout to the node N1. The output voltage Vout corresponds to the amplified output voltage difference "Vout1−Vout2" between the charge transfer feedback amplifier portions 100 and 101 in the data read circuit 52.

In response to the activation period of the trigger pulse φr, the transfer gate 130 transmits the output voltage Vout on the node N1 to the latch circuit 145. The latch circuit 145 outputs the latched output voltage Vout as read data /DOUT. In other words, the output of the data read circuit 53 has a polarity opposite to that of the data bus DB.

Thus, in the data read circuit of the second modification of the first embodiment, the differential amplifier 140 is eliminated. With such a simplified structure, the data read operation can be conducted in the same manner as that of the first modification of the first embodiment.

Note that the first and second modifications of the first embodiment are also applicable to a so-called folded bit line structure.

Figure 8:
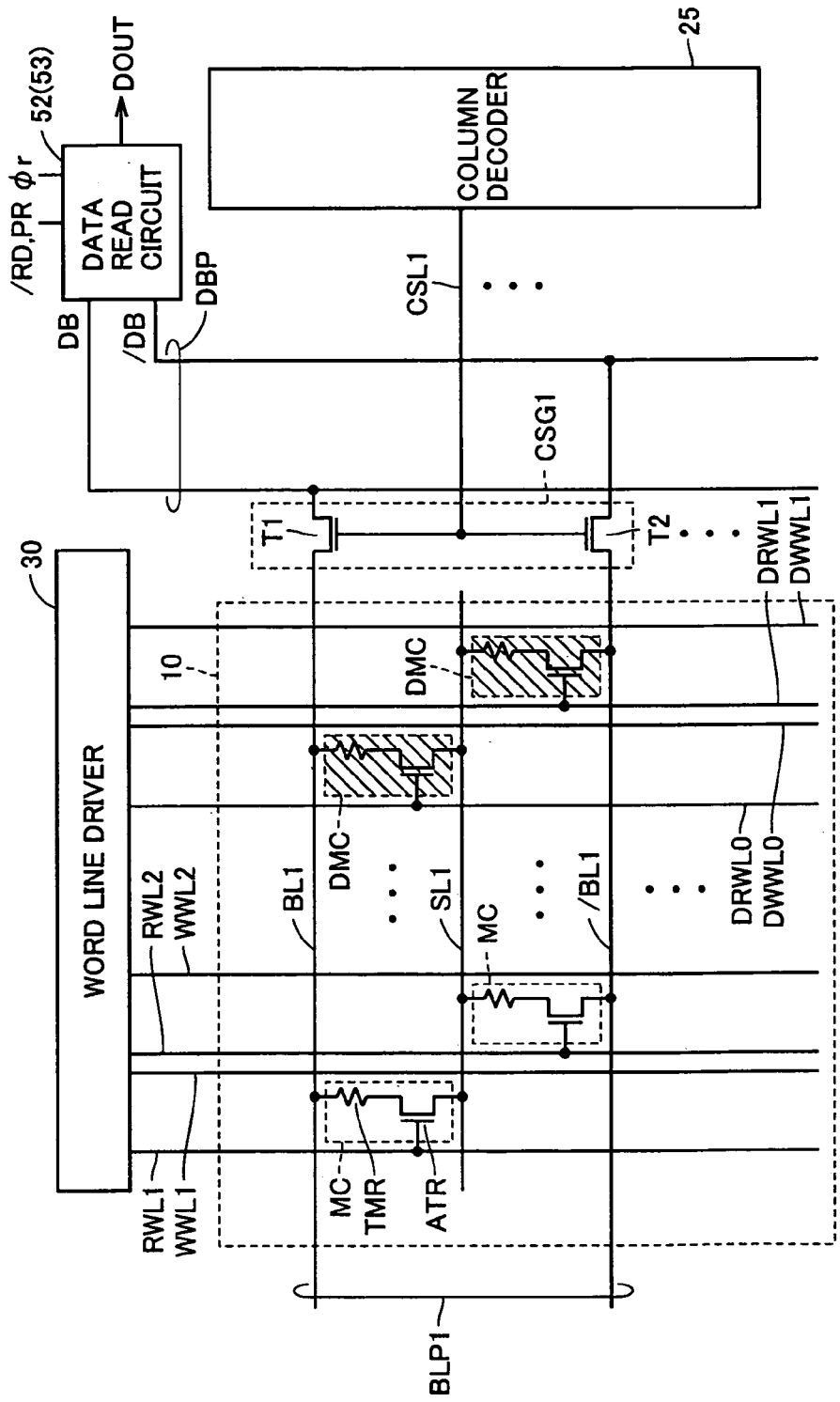
FIG. 8 is a conceptual diagram showing the structure of a memory array and its peripheral circuitry according to the folded bit line structure.

FIG. 8 is a conceptual diagram showing the structure of a memory array 10 and its peripheral circuitry according to the folded bit line structure.

Referring to FIG. 8, in the memory array 10 according to the folded bit line structure, bit line pairs BLP and source lines SL are provided respectively corresponding to the memory cell columns. Each bit line pair BLP is formed from complementary bit lines BL and /BL. FIG. 8 exemplarily shows the bit line pair BLP1 of the bit lines BL1 and /BL1 and the source line SL1 of the first memory cell column.

A column selection gate CSG1 is provided corresponding to the bit lines BL1 and /BL1. The column selection gate CSG1 includes a transistor switch T1 electrically coupled between the bit line BL1 and the data bus DB, and a transistor switch T2 electrically coupled between the bit line /BL1 and the data bus /DB. The transistor switches T1 and T2 are turned ON in response to activation of a corresponding column selection line CSL1. Thus, the column selection gate CSG1 electrically couples the bit lines BL1 and /BL1 to the data buses DB and /DB, respectively, in response to selection of a corresponding memory cell column in the data read operation. A source voltage, i.e., the ground voltage VSS, is supplied to the source line SL1.

The bit line pair, column selection gate, column selection line and source line are similarly provided for the other memory cell columns.

Read word lines RWL1, RWL2, ... and write word lines WWL1, WWL2, ... are provided respectively corresponding to the memory cell rows. The memory cells MC on each column are alternately coupled between the bit lines BL, /BL and the source line. For example, for the memory cells MC on the first column, the memory cell MC on the first row is provided between the bit line BL1 and the source line SL1, and the memory cell MC on the second row is provided between the bit line /BL1 and the source line SL1. Similarly, the memory cells MC on every odd row are provided between the bit lines BL and the source lines SL, and the memory cells MC on every even row are provided between the bit lines /BL and the source lines SL.

Thus, when a read word line RWL is selectively activated according to the row selection result, the memory cell MC is coupled between the bit line BL and the source line SL or between the bit line /BL and the source line SL in each memory cell column.

Dummy memory cells DMC are arranged in two dummy rows. In each memory cell column, the dummy memory cells DMC are respectively provided between the bit lines BL, /BL and the source line SL.

Dummy read word lines DRWL0, DRWL1 and dummy write word lines DWWL0, DWWL1 are provided respectively corresponding to the dummy rows. As described before, the dummy write word lines DWWL0, DWWL1 may be provided in view of continuity of the shape with the memory cell region.

The dummy read word line DRWL0, DRWL1 is selectively activated so as to couple either the bit line BL or /BL of each bit line pair, i.e., the bit line that is not coupled to the memory cell MC, to the dummy memory cell DMC.

More specifically, the dummy read word line DRWL1 is activated when an odd row is selected, whereas the dummy read word line DRWL0 is activated when an even row is selected. As a result, in each memory cell column, one of the memory cell MC and the dummy memory cell DMC is coupled between the bit line BL and the source line SL, and the other is coupled between the bit line /BL and the source line SL.

With such a structure, the data read operation can be conducted in the same manner as that of the first or second modification of the first embodiment by using the data read circuit 52 of FIG. 3 or the data read circuit 53 of FIG. 7 for the data buses DB, /DB of the data bus pair DBP electrically coupled to the bit line pair of the selected column.

In the first embodiment and the first and second modifications thereof, the precharge voltage Vpr of the bit lines BL, /BL and the data buses DB, /DB as well as the source voltage of the memory cells MC and the dummy memory cells DMC are set to the ground voltage VSS. However, these voltages may alternatively be set to another value such as the power supply voltage VDD or half the power supply voltage VDD, i.e., VDD/2. In this case, the driving voltage in the data read operation must be set in view of the source voltage.

Second Embodiment

A variation of the dummy memory cell structure will be described in the second embodiment.

Figure 9A:
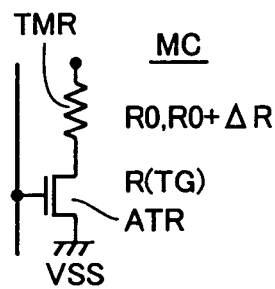
FIGS. 9A to 9C are conceptual diagrams illustrating the structure of a dummy memory cell according to a second embodiment of the present invention.

FIG. 9A shows the structure of the memory cell MC for storing the data. Referring to FIG. 9A, a memory cell MC includes a tunnel magnetic resistive element TMR and an access transistor ATR that are connected in series with each other. The tunnel magnetic resistive element TMR has an electric resistance value of R0 or R0+ΔR (=R1) according to the storage data level. When the access transistor ATR is turned ON (i.e., in a conductive state), the electric resistance value thereof, i.e., the channel resistance value, is R(TG). Accordingly, when the access transistor ATR is conductive, the memory cell MC has an electric resistance value of R0+R(TG) or R0+ΔR+R(TG) according to the storage data level.

Figure 9B:
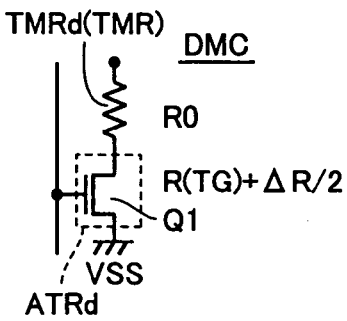

As shown in FIG. 9B, a dummy memory cell DMC includes a dummy resistive element TMRd and a dummy access transistor ATRd that are connected in series with each other. The dummy resistive element TMRd has an electric resistance value R0. Accordingly, the same tunnel resistive element TMR as that of the memory cell MC can be used as the dummy resistive element TMRd. In other words, the dummy resistive element has a same structure as that of the tunnel resistive element TMR.

The dummy access transistor ATRd includes a field effect transistor (FET) Q1. The channel resistance value of the FET Q1 is designed to an intermediate value of R(TG) and R(TG)+ΔR, and desirably designed to R(TG)+ΔR/2 (half of ΔR). For example, the channel resistance value of the FET Q1 can be adjusted with the gate width and gate length thereof. In other words, the FET Q1 has at least one of its gate width and its gate length being different from that of the access transistor ATR.

Thus, when the dummy access transistor ATRd is conductive, the dummy memory cell DMC has an electric resistance value of R0+R(TG)+ΔR/2, i.e., an intermediate value of R0+R(TG) and R1+R(TG).

Figure 9C:
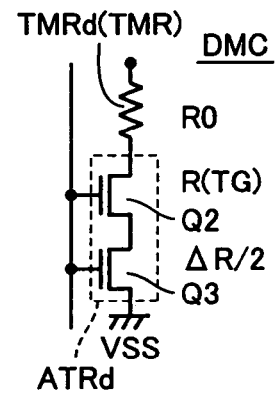

FIG. 9C shows another exemplary structure of the dummy memory cell DMC. Referring to FIG. 9C, the dummy memory cell DMC includes a dummy resistive element TMRd and a dummy access transistor ATRd that are connected in series with each other.

Like the dummy memory cell of FIG. 9B, the dummy resistive element TMR is formed from the same tunnel magnetic resistive element TMR as that of the memory cell MC.

The dummy access transistor ATRd includes field effect transistors (FETs) Q2 and Q3. The FET Q2 is designed to have a channel resistance value R(TG). In other words, the FET Q2 can be designed in common with the access transistor ATR of the memory cell MC.

The FET Q3 is designed to have a channel resistance value smaller than ΔR, and desirably to have a channel resistance value ΔR/2. Like the FET Q1, the channel resistance value of the FET Q3 can be adjusted with the gate width and gate length thereof.

Accordingly, when the dummy access transistor ATRd is conductive, the dummy memory cell DMC has an electric resistance value of R0+R(TG)+ΔR/2, as in the structure of FIG. 9B.

Before data read operation, a data level corresponding to the electric resistance value R0 is magnetically written to the tunnel magnetic resistive element TMR of the dummy memory cell DMC. Thus, the electric resistance value of the dummy resistive element TMRd can be set to R0. The data write operation to the dummy memory cell may either be conducted as part of the initialization sequence upon power-ON of the MRAM device, or may be conducted periodically during operation of the MRAM device. For example, the data write operation to the dummy memory cell may be conducted in each cycle upon every memory access.

When fabricated on the same memory array under the same manufacturing conditions, the tunnel magnetic resistive elements TMR are likely to have the same characteristics. Therefore, by forming both memory cell MC and dummy memory cell DMC with the same tunnel magnetic resistive element TMR, the electric resistance value of the dummy memory cell DMC can be reliably set to an intermediate value of R1 and R0. Thus, the electric resistance value of the dummy memory cell DMC for producing a voltage for comparison with the voltage on the data line coupled to the selected memory cell can be appropriately set while allowing manufacturing variation. As a result, a read operation margin can be ensured regardless of the manufacturing variation.

The dummy memory cell of the second embodiment is typically applicable to the memory array of the open bit line structure shown in FIG. 5 or the memory array of the folded bit line structure shown in FIG. 8. In this case, the data read circuit 52 of FIG. 6 or the data read circuit 53 of FIG. 7 can be used for the data read operation. The charge transfer feedback amplifier portions 100 and 101 may be eliminated from these data read circuits.

First Modification of Second Embodiment

Figure 10A:
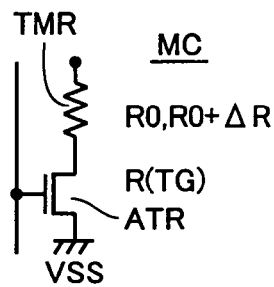
FIGS. 10A and 10B are conceptual diagrams illustrating the structure of a dummy memory cell according to a first modification of the second embodiment.

The structure of the memory cell MC shown in FIG. 10A is the same as that of FIG. 9A. Therefore, detailed description thereof will not be repeated.

Figure 10B:
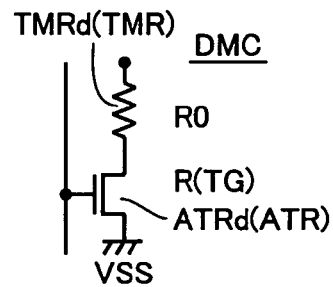

Referring to FIG. 10B, the dummy memory cell DMC is designed so that the dummy resistive element TMRd has an electric resistance value R0 and the dummy access transistor ATRd has a channel resistance value R(TG). In other words, the dummy memory cell DMC and the memory cell MC can be fabricated on the same memory array according to the common design.

The first modification of the second embodiment further includes a dummy resistance adding circuit for adding an electric resistance value ΔR/2, i.e., an electric resistance value to be added by the dummy memory cell DMC, to one of the data buses DB and /DB.

Figure 11:
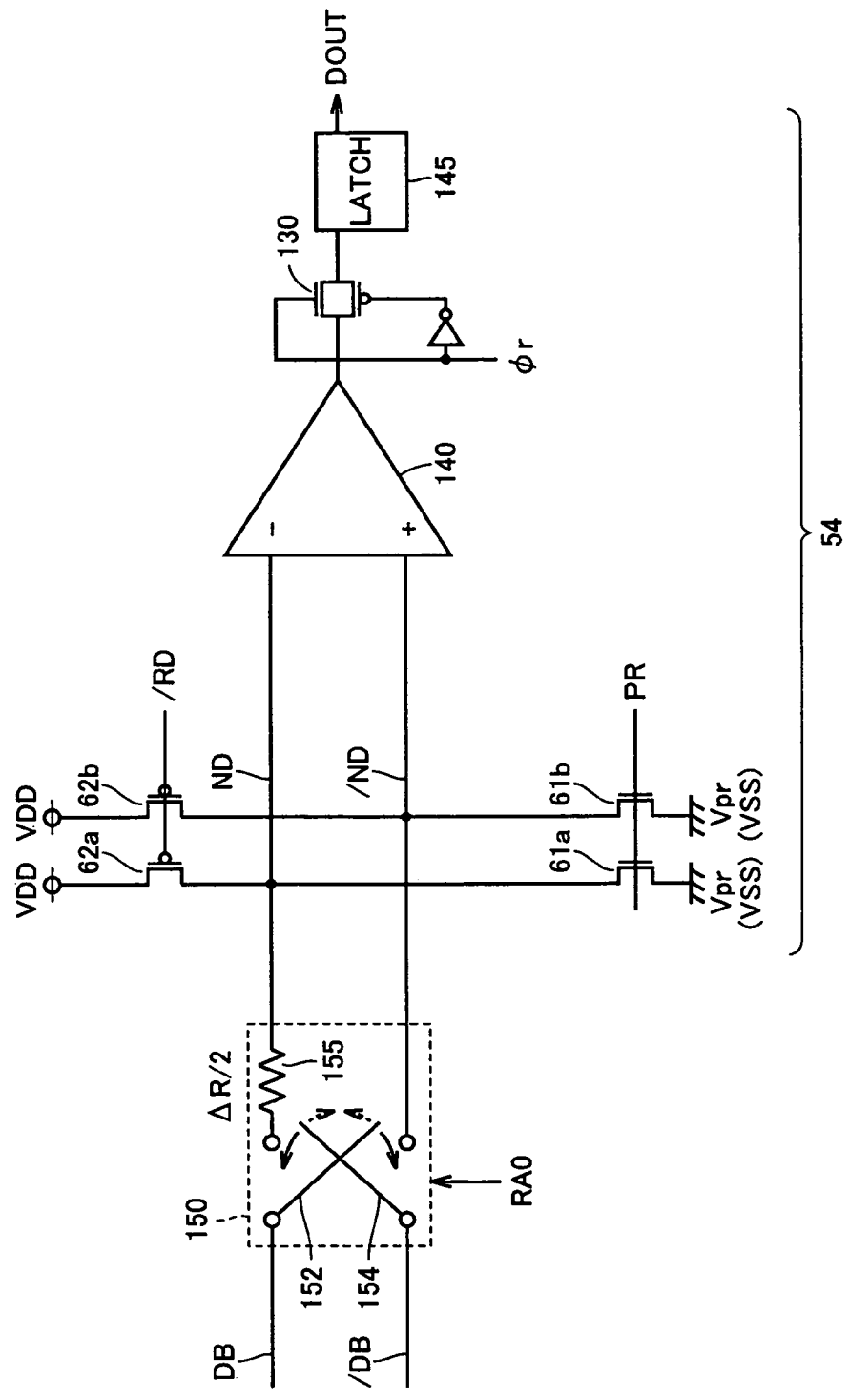
FIG. 11 is a circuit diagram showing the structure of a dummy resistance adding circuit according to the first modification of the second embodiment.

Referring to FIG. 11, the dummy resistance adding circuit 150 is provided between the data buses DB, /DB and a data read circuit 54.

The structure of the data read circuit 54 corresponds to the data read circuit 52, 53 of FIGS. 6 and 7 with its charge transfer feedback amplifier portions 100 and 101 eliminated therefrom. Alternatively, the data read circuit 52 or 53 may be used instead of the data read circuit 54.

The dummy resistance adding circuit 150 has data bus connection switches 152, 154 and a resistive element 155.

The electric resistance value of the resistive element 155 is set to a value equal to or less than the difference ΔR between the electric resistance values R0 and R1 of the memory cell MC, and desirably set to ΔR/2. The resistive element 155 is series-connected to one input node ND.

The data bus connection switch 152 electrically couples the data bus DB to one of the input nodes ND and /ND. The data bus connection switch 154 operates complementarily to the data bus connection switch 152, and electrically couples the data bus /DB to the other input node ND, /ND. Thus, the resistive element 155 can be series-connected to one of the data buses DB and /DB, i.e., the data bus that is connected to the dummy memory cell DMC.

The data bus switch 152, 154 electrically couples one of the data buses DB, /DB, i.e., the data bus that is connected to the dummy memory cell DMC, to the input node ND through the resistive element 155. The other data bus, i.e., the data bus that is connected to the selected memory cell, is electrically coupled directly to the input node /ND.

For example, the data bus connection switches 152 and 154 may operate according to the least significant bit RA0 of the row address. In the memory array of the open bit line structure shown in FIG. 5, the address bit RA0 indicates whether the selected memory cell is located in the memory mat MTa or MTb. In the memory array of the folded bit line structure shown in FIG. 8, the address bit RA0 indicates whether the selected row is an odd row or an even row.

With such a structure, the electric resistance value of the sense current path including the dummy memory cell DMC can be set to the same value as that of the second embodiment. Moreover, according to the first modification of the second embodiment, the memory cell MC and the dummy memory cell DMC in the memory array 10 have the same structure. Therefore, a read operation margin can be ensured according to manufacturing variation of the tunnel magnetic resistive elements TMR.

Second Modification of Second Embodiment

Figure 12:
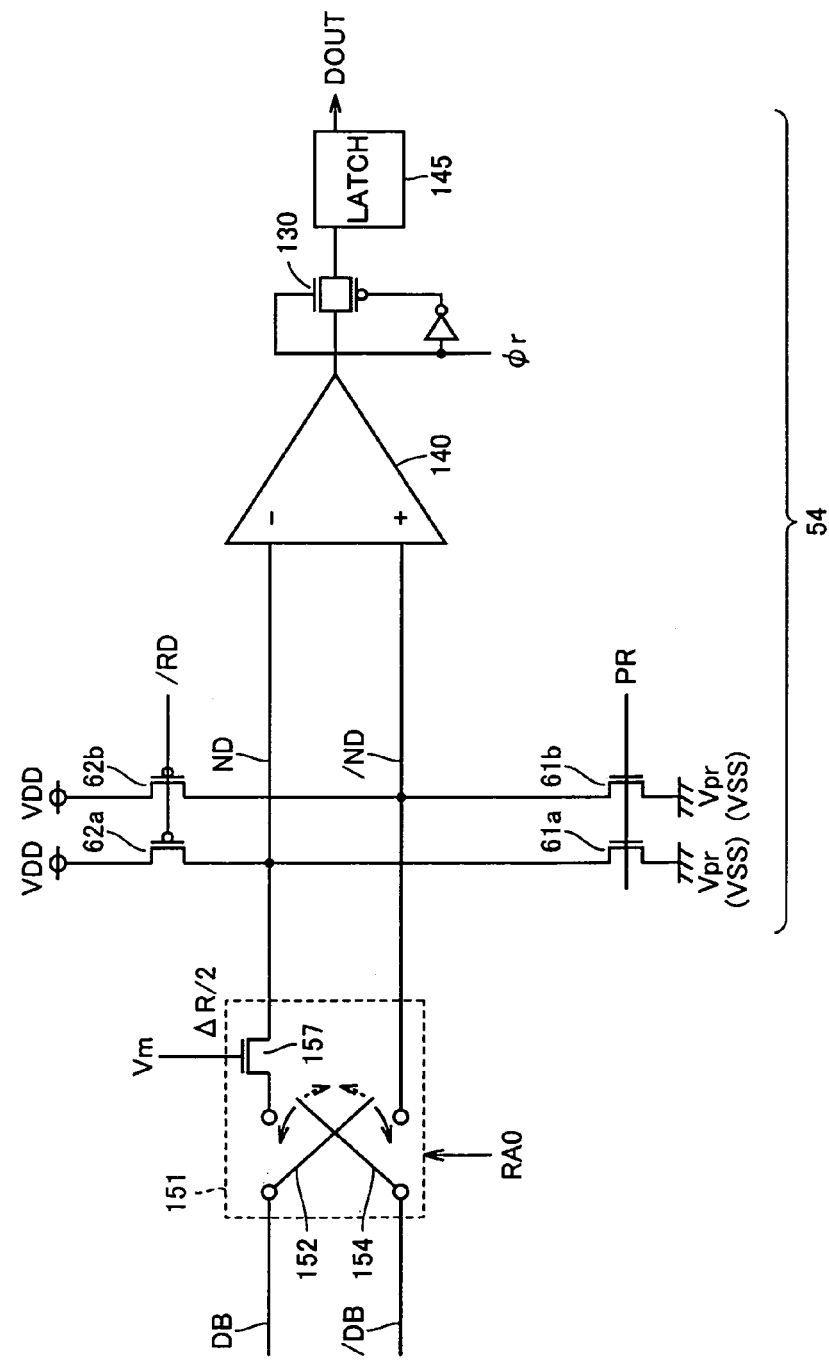
FIG. 12 is a circuit diagram showing the structure of a dummy resistance adding circuit according to a second modification of the second embodiment.

Referring to FIG. 12, a dummy resistance adding circuit 151 according to the second modification of the second embodiment is different from the dummy resistance adding circuit 150 of FIG. 11 in that the resistive element 155 is replaced with a field effect transistor (FET) 157.

The FET 157 is coupled in series to a node ND, and receives a control voltage Vin at its gate. The structure and operation of the dummy resistance adding circuit 151 are otherwise the same as those of the dummy resistance adding circuit 150 of FIG. 11. Since the structure and operation other than the dummy resistance adding circuit are also the same as those of the first modification of the second embodiment, detailed description thereof will not be repeated.

With such a structure, the electric resistance value of the FET 157, i.e., the electric resistance value to be added from the dummy resistance adding circuit 151 to the sense current path including the dummy memory cell DMC, can be adjusted according to the control voltage Vm.

Thus, in addition to the structure of the first modification of the second embodiment, a read operation margin can be ensured according to manufacturing variation of the electric resistance difference ΔR in the tunnel magnetic resistive elements TMR fabricated on the memory array 10.

Although the access elements such as access transistor and dummy access transistor are formed from a field effect transistor in the embodiments of the present invention, a diode may alternatively be applied to the access elements.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor device, comprising:
a plurality of magnetic memory cells each having its electric resistance value varying according to a storage data level written therein by an applied magnetic field;
a first data line electrically coupled to a first voltage through a selected one of said plurality of magnetic memory cells in data read operation;
a first precharging circuit for setting said first data line to a precharge voltage before said data read operation;
a first read driving circuit for supplying a data read current to said first data line in said data read operation;
a first charge transfer feedback amplifier portion provided between said first data line and a first internal node, for retaining a voltage on said first data line and producing a first output voltage onto said first internal node according to an integral value of said data read current flowing through said first data line; and
an amplifier portion for producing read data based on the voltage on said first internal node.

2. The semiconductor device according to claim 1, wherein said precharge voltage is said first voltage, and said first read driving circuit couples said first data line to a second voltage in said data read operation.

3. The semiconductor device according to claim 1, wherein said first charge transfer feedback amplifier portion includes
an operational amplifier for amplifying a voltage difference between first and second input nodes to produce said first output voltage onto said first internal node,
a charge transfer portion coupled between said first data line and said first input node, for transmitting a voltage change on said first data line due to said data read current to said first input node, and
a charge feedback portion coupled between said first internal node and said first data line, for supplying charges according to a change in said first output voltage so as to cancel the voltage change on said first data line from said first voltage, and
said precharge voltage is applied to said second input node.

4. The semiconductor device according to claim 1, wherein said plurality of magnetic memory cells are arranged in a matrix, said semiconductor device further comprising:
a plurality of word lines provided respectively corresponding to magnetic memory cell rows;
a plurality of bit lines provided respectively corresponding to magnetic memory cell columns; and
a column selection portion for connecting one of said plurality of bit lines that is electrically coupled to said selected magnetic memory cell to said first data line.

5. The semiconductor device according to claim 1, further comprising:
a dummy memory cell having an intermediate electric resistance value of two electric resistance values of each magnetic memory cell, said two electric resistance values respectively corresponding to two storage data levels;
a second data line electrically coupled to said first voltage through said dummy memory cell in said data read operation;
a second precharging circuit for setting said second data line to said precharge voltage before said data read operation;
a second read driving circuit for supplying a data read current to said second data line in said data read operation; and
a second charge transfer feedback amplifier portion provided between said second data line and a second internal node, for retaining a voltage on said second data line and producing a second output voltage onto said second internal node according to an integral value of said data read current flowing through said second data line, wherein
said amplifier portion produces said read data according to a voltage difference between said first and second internal nodes.

6. The semiconductor device according to claim 5, wherein said precharge voltage is said first voltage, and said first and second read driving circuits respectively couple said first and second data lines to a second voltage in said data read operation.

7. The semiconductor device according to claim 1, further comprising:
- a dummy memory cell having an intermediate electric resistance value of two electric resistance values of each magnetic memory cell, said two electric resistance values respectively corresponding to two storage data levels;
- a second data line electrically coupled to said first voltage through said dummy memory cell in said data read operation;
- a second precharging circuit for setting said second data line to said precharge voltage before said data read operation;
- a second read driving circuit for supplying the data read current to said second data line in said data read operation;
- a second charge transfer feedback amplifier portion provided between said second data line and a second internal node, for maintaining a voltage on said second data line and producing a second output voltage onto said second internal node according to an integral value of said data read current flowing through said second data line; and
- a charge feedback portion coupled between said second internal node and said first data line, for feeding back with a reversed polarity a change in said second output voltage to said first data line.

8. The semiconductor device according to claim 7, wherein said precharge voltage is said first voltage, and said first and second read driving circuits respectively couple said first and second data lines to a second voltage in said data read operation.

9. The semiconductor device according to claim 1, wherein said first charge transfer feedback amplifier portion includes a charge transfer portion coupled to said first data line, for transmitting a voltage change on said first data line due to said data read current.

10. A semiconductor device, comprising:
- a plurality of magnetic memory cells each having its electric resistance value varying according to a storage data level in accordance with the magnetization orientation;
- a first data line electrically coupled to a first voltage through a selected one of said plurality of magnetic memory cells in data read operation;
- a first precharging circuit for setting said first data line to a precharge voltage before said data read operation;
- a first read driving circuit for supplying a data read current to said first data line in said data read operation;
- a first charge transfer feedback amplifier portion provided between said first data line and a first internal node, for retaining a voltage on said first data line and producing a first output voltage onto said first internal node according to an integral value of said data read current flowing through said first data line; and
- an amplifier portion for producing read data based on the voltage on said first internal node.

* * * * *